United States Patent
Huang et al.

(10) Patent No.: US 6,249,433 B1
(45) Date of Patent: Jun. 19, 2001

(54) HEAT-DISSIPATING DEVICE FOR INTEGRATED CIRCUIT PACKAGE

(75) Inventors: Chien-Ping Huang, Hsinchu Hsien; Jui-Meng Jao, Miaoli, both of (TW)

(73) Assignee: Siliconware Precision Industries, Taichung (TW)

( * ) Notice: Subject to any disclaimer, the term of this patent is extended or adjusted under 35 U.S.C. 154(b) by 0 days.

(21) Appl. No.: 09/470,070

(22) Filed: Dec. 22, 1999

(30) Foreign Application Priority Data

May 14, 1999 (TW) .............................. 088107818

(51) Int. Cl.[7] ...................................... H05K 7/20
(52) U.S. Cl. .................. 361/704; 361/688; 361/707; 361/709; 257/706; 257/707; 257/796; 165/80.2; 165/185
(58) Field of Search ................... 361/688, 690, 361/702, 703, 704, 705, 707, 712, 713, 717, 718, 719; 257/675, 706, 707, 712, 713, 717, 722; 165/80.3, 80.2

(56) References Cited

U.S. PATENT DOCUMENTS

| | | | |
|---|---|---|---|
| 5,041,902 | * 8/1991 | McShane | ............... 257/706 |
| 5,455,462 | * 10/1995 | Marrs | ................... 361/688 |
| 5,705,851 | * 1/1998 | Mostafazadeh et al. | ............ 257/675 |
| 5,773,886 | * 6/1998 | Rostoker et al. | ..................... 361/703 |
| 5,892,278 | * 4/1999 | Horita et al. | ......................... 257/706 |
| 5,977,626 | * 11/1999 | Wang et al. | ......................... 257/707 |

* cited by examiner

Primary Examiner—Leo P. Picard
Assistant Examiner—Boris L. Chervinsky
(74) Attorney, Agent, or Firm—Peter F. Corless; Edward & Angell, LLP

(57) ABSTRACT

A heat-dissipating device is designed for use in an integrated circuit package for heat dissipation. The heat-dissipating device is a molded piece of a heat-conductive material, having an exterior side which is to be exposed to the outside of the integrated circuit package. The heat-dissipating device is characterized in the forming of a staircase-like cutaway part at the edge of the exterior side thereof, which is formed with a plurality of stepped surfaces. During the molding process, the staircase-like cutaway part can help slow down the flowing speed of the encapsulation resin flow, so that the resin flow would hardly flash onto the exterior side of the heat-conductive device. In addition, the staircase-like form of the cutaway part provides a lengthier path that would hardly allow outside moisture to penetrate to the inside of the integrated circuit package and cause popcorn effect in the integrated circuit package. The manufactured integrated circuit package is therefore more reliable to use.

19 Claims, 3 Drawing Sheets ically rolled over, which would cause the encapsulating resin used in the molding process to flash through these rounded corners to the exposed area of the heat-dissipating device and thereby covers a considerable part of the exposed area of the heat-dissipating device. This would degrade the heat-dissipating efficiency. Moreover, the flashed resin would cause the exposed area of the heat-dissipating device to lose planarity, making the heat-dissipating device unable to be linked securely to the external heat-dissipating means. The flashed resin can be removed through sanding or laser polishing, but such post-treatment would undesirably increase the overall manufacture cost and may easily cause surface damage to the integrated circuit package.

HEAT-DISSIPATING DEVICE FOR INTEGRATED CIRCUIT PACKAGE

BACKGROUND OF THE INVENTION

1. Field of the Invention

This invention relates to integrated circuit (IC) packaging technology, and more particularly, to a heat-dissipating device for use in an integrated circuit package for heat dissipation.

2. Description of Related Art

An integrated circuit package is used to enclose one or more semiconductor chips therein for easy handling and utilization. During operation of the semiconductor chips, however, electricity will cause the semiconductor chips to produce heat. If the heat is not effectively dissipated, it can cause damage to the internal circuitry or electronic components of the semiconductor chips. Therefore, there is a need for providing internal heat-dissipating means in the integrated circuit package for heat dissipation during operation. Conventionally, this can be achieved by embedding a heat sink or a heat block within integrated circuit package, or by directing a stream of cooled air or liquid against the semiconductor chips. When using a heat sink or a heat block, it is required to expose a part of the heat sink or heat block to the outside of the encapsulant for enclosing the semiconductor chip so that the heat can be dissipated to the atmosphere or another externally linked heat-dissipating means. In design, it is desired to increase the exposed area to the atmosphere and shorten the heat-conducting path from the heat-generating source to the exposed area for the purpose of increasing the heat-dissipating efficiency.

One drawback to the use of heat sink or heat block, however, is that, since such heat-dissipating devices are molded through stamping, the edges there of would be undesirably rolled over, which would cause the encapsulating resin used in the molding process to flash through these rounded corners to the exposed area of the heat-dissipating device and thereby covers a considerable part of the exposed area of the heat-dissipating device. This would degrade the heat-dissipating efficiency. Moreover, the flashed resin would cause the exposed area of the heat-dissipating device to lose planarity, making the heat-dissipating device unable to be linked securely to the external heat-dissipating means. The flashed resin can be removed through sanding or laser polishing, but such post-treatment would undesirably increase the overall manufacture cost and may easily cause surface damage to the integrated circuit package.

FIG. 6 is a schematic sectional diagram of an integrated circuit package incorporating a conventional heat-dissipating device. As shown, the heat-dissipating device 16 is a molded piece of a heat-conductive material, having a top side exposed to the outside of the encapsulant 17. Further, the heat-dissipating device 16 is formed with a cutaway part 16a at the edge thereof. During the molding process, the cutaway part 16a can help prevent the melted encapsulation resin from flashing onto the exposed surface of the heat-dissipating device 16. When the melted resin enters the cutaway part 16a, it would be increased in viscosity and thus reduced in flowability so that it would hardly flash. One drawback to this heat-dissipating device 16, however, is that the cutaway part 16a is flat and narrow, which would nevertheless allow a small but considerable part of the melted resin to flash onto the exposed surface of the heat-dissipating device 16.

One solution to the foregoing problem is depicted in FIG. 7. As shown, in this heat-dissipating device, a metal layer 31 of silver or platinum is coated over the cutaway part 16a. The flashed encapsulation resin adheres to this metal layer 31 with a less strength than to the heat-dissipating device 16; and therefore, the flashed resin over the exposed surface of the heat-dissipating device 16, if any, can be easily removable during post-treatment. One drawback to this solution, however, is that the coating of the metal layer 31 over the cutaway part 16a of the heat-dissipating device 16 would make the overall manufacture process more complex, and thus would undesirably increase the manufacture cost. In addition, it would not prevent the flashing of the encapsulation resin over the exposed surface of the heat-dissipating device 16.

SUMMARY OF THE INVENTION

It is therefore an objective of this invention to provide a heat-dissipating device for integrated circuit package, which can prevent the melted encapsulation resin from flashing over the exposed area of the heat-dissipating device.

It is another objective of this invention to provide a heat-dissipating device for integrated circuit package, which can help prevent outside moisture from entering into the integrated circuit package that would otherwise cause delamination in the integrated circuit package.

It is still another objective of this invention to provide a heat-dissipating device for integrated circuit package, which can help increase the heat-dissipating efficiency.

In accordance with the foregoing and other objectives, the invention provides an improved heat-dissipating device for integrated circuit package. The heat-dissipating device of the invention is made of a heat-conductive material, having an exterior side which is to be exposed to the outside of the integrated circuit package. The heat-dissipating device of the invention is characterized in the forming of a staircase-like cutaway part at the edge of the exterior side thereof, which is formed with a plurality of stepped surfaces.

During the molding process, when the resin flow enters into the first stepped surface, the resin flow would absorb the heat from the mold, thereby being increased in viscosity and thus reduced in flowability. Onwards, the resin flow flows into the next stepped surface, where, since the next stepped surface is smaller in depth than the first stepped surface, the resin flow would be further slowed down; and similarly, when the resin enters into the next stepped surface, it would be still further slowed down. Since the resin flow is reduced in flowing speed at the successive stepped surfaces, it would hardly flash onto the exterior side of the heat-conductive device. Therefore, the invention can prevent the resin flow from flashing onto the exterior side of the heat-conductive device. Compared to the prior art, since the resin would hardly flash, the exposed surface of the heat-conductive device would not be covered by flashed resin, thus ensuring the heat-dissipating efficiency. The staircase-like cutaway part preferably has a total width of from 0.6 mm to 1.5 mm and a total depth of from 0.06 mm to 0.15 mm; and more preferably, the staircase-like cutaway part has a total width of from 1.0 mm to 1.3 mm and a total depth of from 0.10 mm to 0.13 mm.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
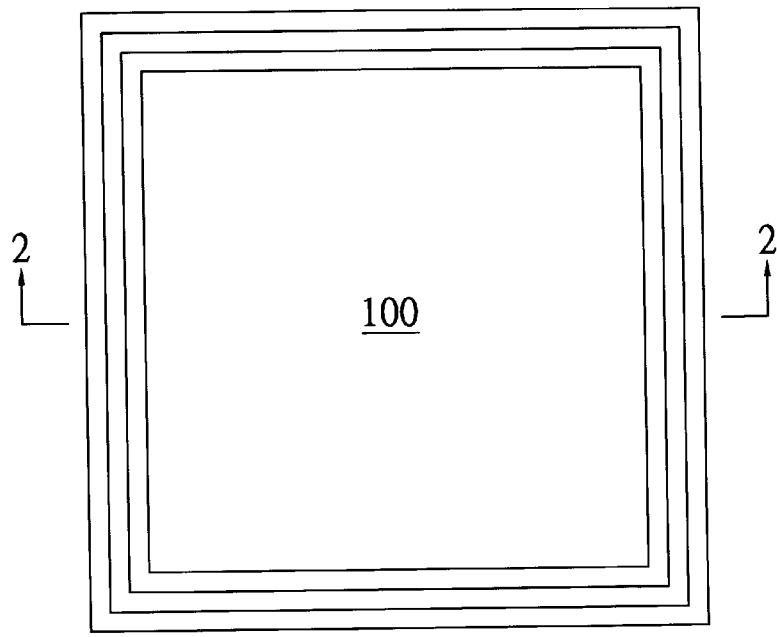
FIG. 1 is a schematic top view of a preferred embodiment of the heat-dissipating device according to the invention.
Figure 2:
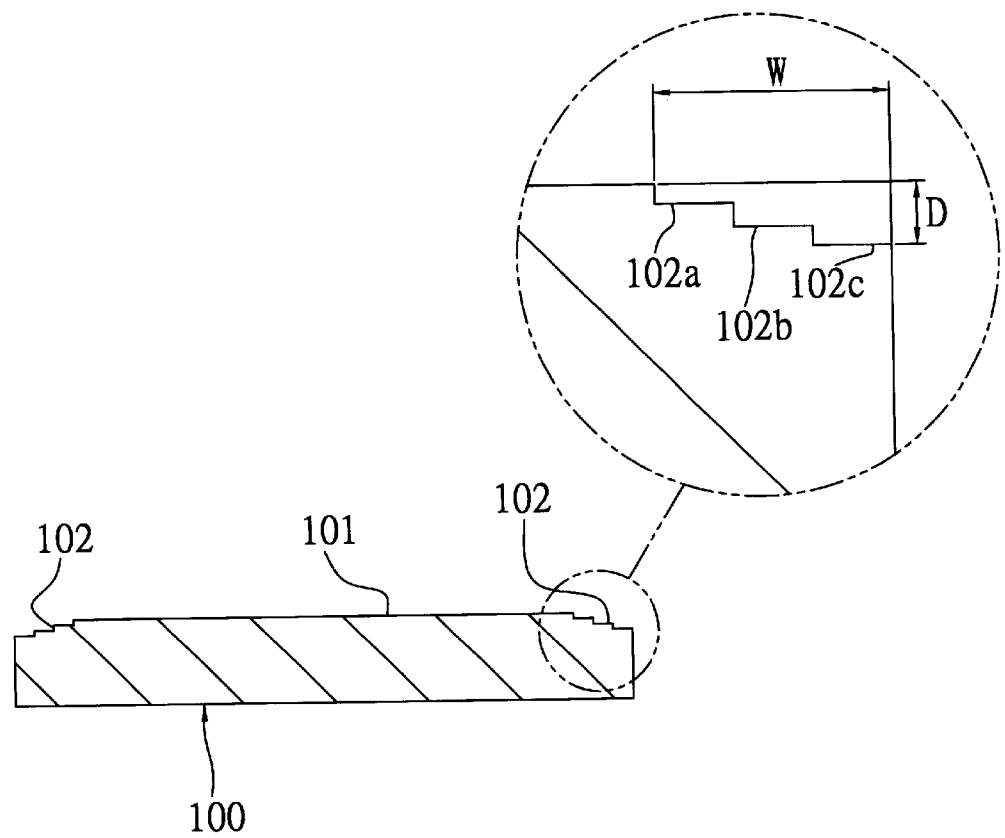
FIG. 2 is a schematic sectional diagram of the heat-dissipating device of FIG. 1 cutting through the line 2—2.

FIG. 1 is a schematic top view of a preferred embodiment of the heat-dissipating device according to the invention; and FIG. 2 is a schematic sectional diagram of the heat-dissipating device of FIG. 1 cutting through the line 2—2.

As shown, the heat-dissipating device 100 of the invention is a molded piece of a heat-conductive material, such as copper or aluminum. The heat-dissipating device 100 has an exterior side 101 where a staircase-like cutaway part 102 is formed at the edge. In this embodiment, for example, the staircase-like cutaway part 102 includes three stepped surfaces 102a, 102b, 102c.

As shown in the enlarged view in FIG. 2, the staircase-like cutaway part 102 has a total width W and a total depth D. Preferably, the total width W is from 0.6 mm to 1.5 mm, and the total depth D is from 0.06 mm to 0.15 mm. More preferably, the total width W is from 1.0 mm to 1.3 mm, and the total depth D is from 0.10 mm to 0.13 mm. In this embodiment, the total width W is 1.2 mm and the total depth D is 0.12 mm.

Since the stepped surfaces 102a, 102b, 102c are all very small in depth, the stamping process would not cause roll-over to the edges of the heat-dissipating device 100 and to the angled part between the exterior side 101 and the first stepped surface 102a. The drawback of flashing due to undesirably roll-over in the prior art can thus eliminated.

Figure 3:
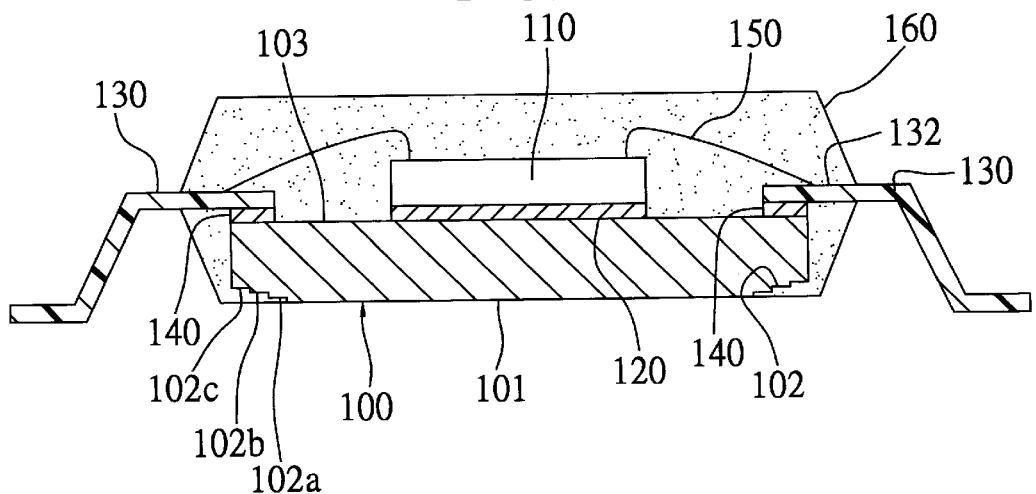
FIG. 3 is a schematic sectional diagram of a first example of an integrated circuit package which incorporates the heat-dissipating device of the invention.

FIG. 3 is a schematic sectional diagram of a first example of an integrated circuit package which incorporates the heat-dissipating device of the invention. In FIG. 3, the heat-dissipating device of the invention is designated by the reference numeral 100.

As shown, this integrated circuit package includes an integrated circuit chip 110 and a plurality of leads 130. The integrated circuit chip 110 is mounted on the back side 103 of the heat-conductive device 100 by means of an adhesive layer 120, such as a layer of silver paste; and the leads 130 each have its inner part 132 fixed to the edge of the back side 103 of the heat-conductive device 100 by means of an adhesive layer 140. Further, the integrated circuit chip 110 is electrically connected to the leads 130 via a set of bonding wires 150. Since the inner parts 132 of the leads 130 and bonding pads (not shown) of the integrated circuit chip 110 are both positioned directly above the heat-conductive device 100, they can be firmly supported during the wire-bonding process. Next, an encapsulant 160 is molded to encapsulate the heat-conductive device 100, the integrated circuit chip 110, the bonding wires 150, and the inner parts of the leads 130. The exterior side 101 of the heat-conductive device 100 is exposed to the outside of the encapsulant 160, so as to allow the heat from the integrated circuit chip 110 to be dissipated through the heat-conductive device 100 to the atmosphere or an externally linked heat-dissipating means (not shown).

During the molding process, the exterior side 101 of the heat-conductive device 100 is attached directly to the bottom of the cavity of a mold (not shown) used to form the encapsulant 160. Therefore, when the flowing encapsulation resin flow enters into the third stepped surface 102c, the resin flow would absorb the heat from the mold, thereby being increased in viscosity and thus reduced in flowability. Onwards, the resin flows into the second stepped surface 102b, where, since the second stepped surface 102b is smaller in depth than the third stepped surface 102c, the resin flow would be further slowed down; and similarly, when the resin flow enters into the first stepped surface 102a, it would be still further slowed down. Since the resin flow is signiticantly reduced in flowing speed at the first stepped surface 102a it would hardly flash onto the exterior side 101 of the heat-conductive device 100. Therefore, the invention can help prevent the flashing of the resin flow onto the exterior side 101 of the heat-conductive device 100. Compared to the prior art, since the encapsulation resin would hardly flash, the exposed surface of the heat-conductive device 100 would not be covered by flashed resin, thus ensuring the heat-dissipating efficiency. Moreover, it can help allow the exterior side 101 of the heat-conductive device 100 to be planarized without being covered by flashed resin, so that the exterior side 101 of the heat-conductive device 100 can be reliably linked to an external heat-dissipating means (not shown). Since no post-treatment is required to remove flashed resin from the heat-dissipating device after the molding process, the overall manufacture process is simplified as compared to the prior art. In addition, the three stepped surfaces 102a, 102b, 102c in combination form a lengthier path that would hardly allow outside moisture to penetrate to the inside of the integrated circuit package. The manufactured integrated circuit package is therefore more reliable to use.

Figure 4:
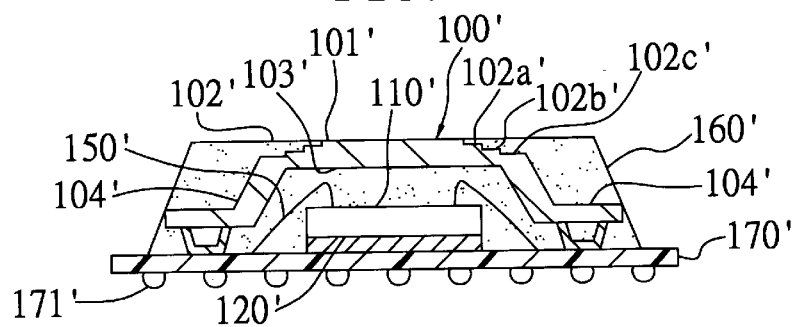
FIG. 4 is a schematic sectional diagram of a second example of an integrated circuit package which incorporates the heat-dissipating device of the invention.

FIG. 4 is a schematic sectional diagram of a second example of an integrated circuit package which incorporates the heat-dissipating device of the invention. In this example, the integrated circuit package is a BGA (Ball Grid Array) integrated circuit package. For distinguishing purpose, the reference numerals in the example of FIG. 4 are appended with a prime mark.

The BGA integrated circuit package includes an integrated circuit chip 110' mounted by means of an adhesive layer 120' on a substrate 170'. On the bottom side of the substrate 170', a plurality of solder balls 171' are bonded to conductive traces (not shown) on the bottom side of the substrate 170', and the integrated circuit chip 110' is electrically connected to these solder balls 171' via a set of bonding wires 150'.

This example differs from the previous one shown in FIG. 3 particularly in that the heat-conductive device 100' is molded in a different shape to include a bent portion 104' which is used to support the entire body of the heat-conductive device 100' on the substrate 170' in such a manner that the interior side 103' of the heat-conductive device 100' is separated from the bonding wires 150' and the top side of the integrated circuit chip 110'. Further, the heat-conductive device 100' is mounted in such a manner that the exterior side 101' of the heat-conductive device 100' is exposed to the atmosphere from the top surface of the encapsulant 160' rather than from the bottom surface as in the previous example of FIG. 3. During the molding process, the staircase-like cutaway part 102', i.e., the combined structure of the three stepped surfaces 102a', 102c', 102c', can prevent the encapsulation resin flow from flashing onto the exterior side 101' of the heat-conductive device 100'.

Figure 5:
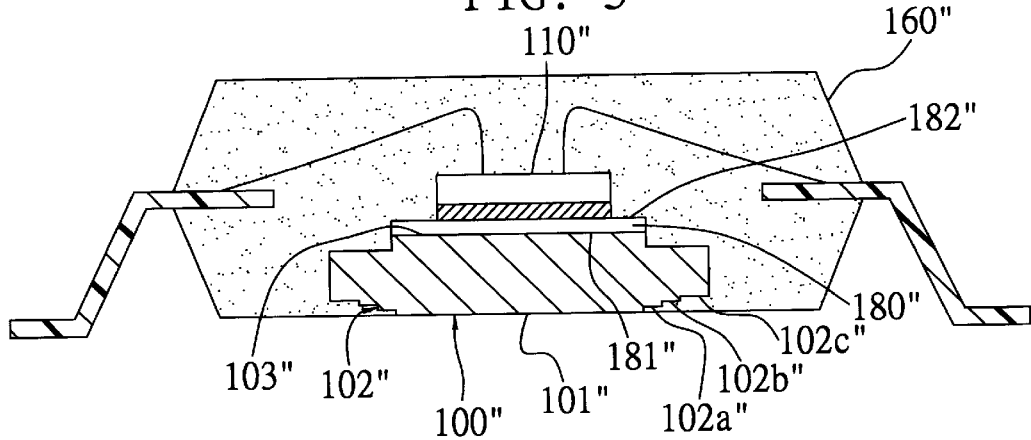
FIG. 5 is a schematic sectional diagram of a third example of an integrated circuit package which incorporates the heat-dissipating device of the invention.
Figure 6:
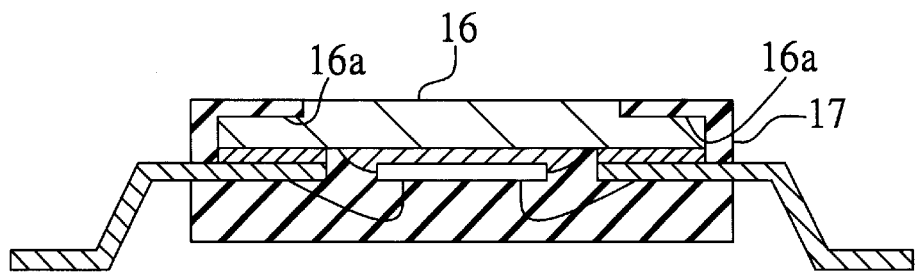
FIG. 6 (PRIOR ART) is a schematic sectional diagram of an integrated circuit package incorporating a first conventional heat-dissipating device.
Figure 7:
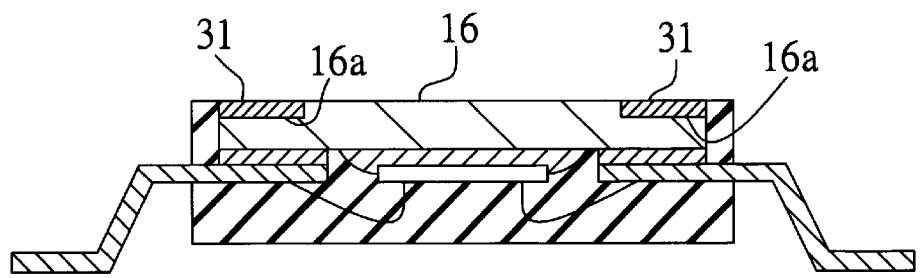
FIG. 7 (PRIOR ART) is a schematic sectional diagram of an integrated circuit package incorporating a second conventional heat-dissipating device.

FIG. 5 is a schematic sectional diagram of a third example of an integrated circuit package which incorporates the heat-dissipating device of the invention. For distinguishing purpose, the reference numerals in this example of FIG. 5 are appended with a double-prime mark.

In this integrated circuit package, the heat-conductive device 100" is arranged on the bottom side of the encapsulant 160", with its exterior side 101" exposed to the outside of the encapsulant 160" and its interior side 103" attached to the bottom side 181" of a die pad 180". The integrated circuit chip 110" is mounted on the upper side 182" of the die pad 180". This arrangement allows the heat from the integrated circuit chip 110" to be conducted through the die pad 180" to the heat-conductive device 100" and then through the exterior side 101" of the heat-conductive device 100" to the atmosphere or an externally linked heat-dissipating means (not shown). During the molding process, the staircase-like cutaway part 102", i.e., the combined structure of the three stepped surfaces 102a", 102b", 102c", can prevent the encapsulation resin flow from flashing onto the exterior side 101" of the heat-conductive device 100".

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat-dissipating device for an integrated circuit package, which is a made of a heat-conductive material, having an exterior side which is to be exposed to the outside of the integrated circuit package; the heat-dissipating device being formed with a staircase-like cutaway part at the edge of the exterior side thereof.

2. The heat-dissipating device of claim 1, wherein the staircase-like cutaway part includes at least two stepped surfaces.

3. The heat-dissipating device of claim 2, wherein the staircase-like cutaway part includes three stepped surfaces.

4. The heat-dissipating device of claim 1, wherein the heat-conductive material is copper.

5. The heat-dissipating device of claim 1, wherein the heat-conductive material is aluminum.

6. The heat-dissipating device of claim 1, wherein the staircase-like cutaway part has a total width of from 0.6 mm to 1.5 mm and a total depth of from 0.06 mm to 0.15 mm.

7. The heat-dissipating device of claim 6, wherein the staircase-like cutaway part has a total width of from 1.0 mm to 1.3 mm and a total depth of from 0.10 mm to 0.13 mm.

8. An integrated circuit package with heat dissipation device, which comprises:
   an integrated circuit chip;
   a plurality of leads electrically connected to the integrated circuit chip; and
   a heat-dissipating device attached to the integrated circuit chip, which is made of a heat-conductive material, having an exterior side which is to be exposed to the outside of the integrated circuit package; the heat-dissipating device being formed with a staircase-like cutaway part at the edge of the exterior side thereof.

9. The integrated circuit package of claim 8, wherein the staircase-like cutaway part includes at least two stepped surfaces.

10. The integrated circuit package of claim 8, wherein the heat-conductive material is copper.

11. The integrated circuit package of claim 8, wherein the heat-conductive material is aluminum.

12. The integrated circuit package of claim 8, wherein the staircase-like cutaway part has a total width of from 0.6 mm to 1.5 mm and a total depth of from 0.06 mm to 0.05 mm.

13. The heat-dissipating device of claim 12, wherein the staircase-like cutaway part has a total width of from 1.0 mm to 1.3 mm and a total depth of from 0.10 mm to 0.13 mm.

14. A BGA integrated circuit package with heat dissipation device, which comprises:
   a substrate having a first side and a second side;
   an integrated circuit chip mounted on the first side of the substrate;
   a plurality of conductive means mounted on the second side of the substrate and electrically connected to the integrated circuit chip; and
   a heat-dissipating device having a bent portion attached to the first side of the substrate to support the heat-dissipating device above the integrated circuit chip; the heat-dissipating device being made of a heat-conductive material, having an exposed surface which is exposed to the outside of the integrated circuit package; the heat-dissipating device being formed with a staircase-like cutaway part at the edge of the exposed surface thereof.

15. The BGA integrated circuit package of claim 14, wherein the staircase-like cutaway part includes at least two stepped surfaces.

16. The BGA integrated circuit package of claim 14, wherein the heat-conductive material is copper.

17. The BGA integrated circuit package of claim 14, wherein the heat-conductive material is aluminum.

18. The BGA integrated circuit package of claim 14, wherein the staircase-like cutaway part has a total width of from 0.6 mm to 1.5 mm and a total depth of from 0.06 mm to 0.15 mm.

19. The BGA integrated circuit package of claim 18, wherein the staircase-like cutaway part has a total width of from 1.0 mm to 1.3 mm and a total depth of from 0.10 mm to 0.13 mm.

\* \* \* \* \*